(12) United States Patent
Martin

(10) Patent No.: US 9,100,042 B2
(45) Date of Patent: Aug. 4, 2015

(54) HIGH THROUGHPUT DECODING OF VARIABLE LENGTH DATA SYMBOLS

(71) Applicant: International Business Machines Corporation, Armonk, NY (US)

(72) Inventor: Andrew K. Martin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 13/922,964

(22) Filed: Jun. 20, 2013

(65) Prior Publication Data

US 2014/0375482 A1    Dec. 25, 2014

(51) Int. Cl.
*H03M 7/40*      (2006.01)
*H03M 7/30*      (2006.01)

(52) U.S. Cl.
CPC .............. *H03M 7/4037* (2013.01); *H03M 7/40* (2013.01); *H03M 7/6005* (2013.01); *H03M 7/6023* (2013.01); *H03M 7/6029* (2013.01)

(58) Field of Classification Search
CPC ......... H03M 7/40; H03M 7/42; H03M 7/425; H03M 7/4037; H03M 7/6005; H03M 7/6023; H03M 7/6029; H04B 1/66
USPC .................................. 375/253; 341/51, 65, 67
See application file for complete search history.

(56) References Cited

U.S. PATENT DOCUMENTS

| | | | |
|---|---|---|---|
| 5,404,138 A * | 4/1995 | Kim et al. ......................... | 341/67 |
| 5,491,480 A * | 2/1996 | Jan et al. ........................... | 341/67 |
| 5,638,069 A * | 6/1997 | Rensink et al. .................. | 341/67 |
| 2001/0054973 A1* | 12/2001 | Kobayashi ....................... | 341/67 |
| 2004/0190635 A1* | 9/2004 | Ruehle ........................... | 375/253 |
| 2010/0182171 A1 | 7/2010 | Hara et al. | |
| 2013/0007554 A1 | 1/2013 | Chen et al. | |

FOREIGN PATENT DOCUMENTS

| | | |
|---|---|---|
| JP | 2002076907 A | 3/2012 |
| KR | 101151352 B1 | 6/2012 |

OTHER PUBLICATIONS

Adler, et al., "Algorithms for Sliding Block Codes (An Application of Symbolic Dynamics to Information Theory)", IP.com Electronic Publication: Mar. 30, 2007 (Original Publication May 11, 1982), 75 pages.
Nikara, "Mulitple-Symbol Parallel Decoding for Variable Length Codes", IEEE Transactions on Very Large Scale Integration (VLSI) Systems, vol. 12, No. 7, Jul. 2004, pp. 676-685.
Yeo et al, "High Throughput Parallel Decoding Method for H.264/AVC CAVLC", ETRI Journal, vol. 31, No. 5, Oct. 2009, pp. 510-551.

* cited by examiner

*Primary Examiner* — David B. Lugo
(74) *Attorney, Agent, or Firm* — Cantor Colburn LLP; William Stock

(57) ABSTRACT

A method of decoding data includes: receiving an encoded data stream transmitted as a plurality of variable length symbols; dividing the data stream into a sequence of blocks, each block having a sequence of adjacent bit positions starting a first bit position and ending with a last bit position; pre-processing each block prior to fully decoding each block, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and fully decoding each block by decoding a first block starting at the first bit position and decoding each adjacent block starting at the starting position.

10 Claims, 4 Drawing Sheets

HIGH THROUGHPUT DECODING OF VARIABLE LENGTH DATA SYMBOLS

BACKGROUND

Some coding and/or compression algorithms transmit data in encoded streams that are represented by symbols having varying lengths. For example, huffman encoded files include symbol lengths that can vary from 1 bit to 28 bits long. Such variable length symbol encoding schemes typically require that encoded data be decoded sequentially, which can significantly restrict throughput.

SUMMARY

Exemplary embodiments include a method of decoding data. The method includes: receiving a data stream, the data stream encoded by an encoding algorithm and transmitted as a plurality of variable length symbols; dividing the data stream into a sequence of blocks, each block having a sequence of adjacent bit positions starting a first bit position and ending with a last bit position; pre-processing each block prior to fully decoding each block, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and fully decoding each block by decoding a first block starting at the first bit position and decoding each adjacent block starting at the starting position.

Other exemplary embodiments include an apparatus for decoding data that includes a processing system including a pre-processing engine and a decoding pipeline. The processing system is configured to perform a method including: receiving a data stream, the data stream encoded by an encoding algorithm and transmitted as a plurality of variable length symbols; dividing the data stream into a sequence of blocks, each block having a sequence of adjacent bit positions starting a first bit position and ending with a last bit position; pre-processing each block prior to fully decoding each block by the pre-processing engine, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and inputting the data stream into the pipeline and fully decoding each block by decoding a first block starting at the first bit position and decoding each adjacent block starting at the starting position.

Further exemplary embodiments include a computer program product for decoding data and including a tangible storage medium readable by a processing circuit and storing instructions for execution by the processing circuit for performing a method. The method includes: receiving a data stream, the data stream encoded by an encoding algorithm and transmitted as a plurality of variable length symbols; dividing the data stream into a sequence of blocks, each block having a sequence of adjacent bit positions starting a first bit position and ending with a last bit position; pre-processing each block prior to fully decoding each block, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and fully decoding each block by decoding a first block starting at the first bit position and decoding each adjacent block starting at the starting position.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

There are provided systems and methods for facilitating decompression and decoding of received data. In exemplary embodiments, the systems and methods include high-throughput decoding of multiple variable length symbols.

In one embodiment, a method performed by a suitable machine or processor includes dividing received encoded data into sequential fixed length blocks (e.g., 8 bytes per line). The data may be encoded via an encoding scheme that specifies symbols having variable lengths. For example, each block is a segment of an encoded data stream having a fixed number of bits. The machine pre-processes each block without any prior information about the starting position of the first symbol in each block. Pre-processing includes calculating, for each possible starting position in a current block (e.g., each possible bit position), all possible starting positions in the next block based on the symbols provided by the coding scheme. For example, the machine selects a possible starting position and determines what the starting position in the next block would be if a symbol starts at the selected starting position. In one embodiment, this determination is performed sequentially starting from the last position to the first position of the current block.

The results of the pre-processing may be stored in look-up tables or other suitable data structures to allow one or more processors to quickly determine the starting position of each block so that the data stream can be decoded in parallel. In one embodiment, the processor can compute in one clock cycle the starting position of the first symbol in the next block, given the starting position of the first symbol in the current block. This allows a high-bandwidth pipelined decompressor implementation.

The systems and methods described herein facilitate efficient decoding and/or decompression. The systems and methods can be embodied in software and/or hardware implementations.

For example, compression/decompression can be offloaded to improve performance. The systems and methods allow offloaded decompression hardware to perform at levels that are comparable to or exceed processor performance by maintaining a throughput in which multiple symbols are decoded per cycle, e.g., decoded in parallel.

Figure 1:
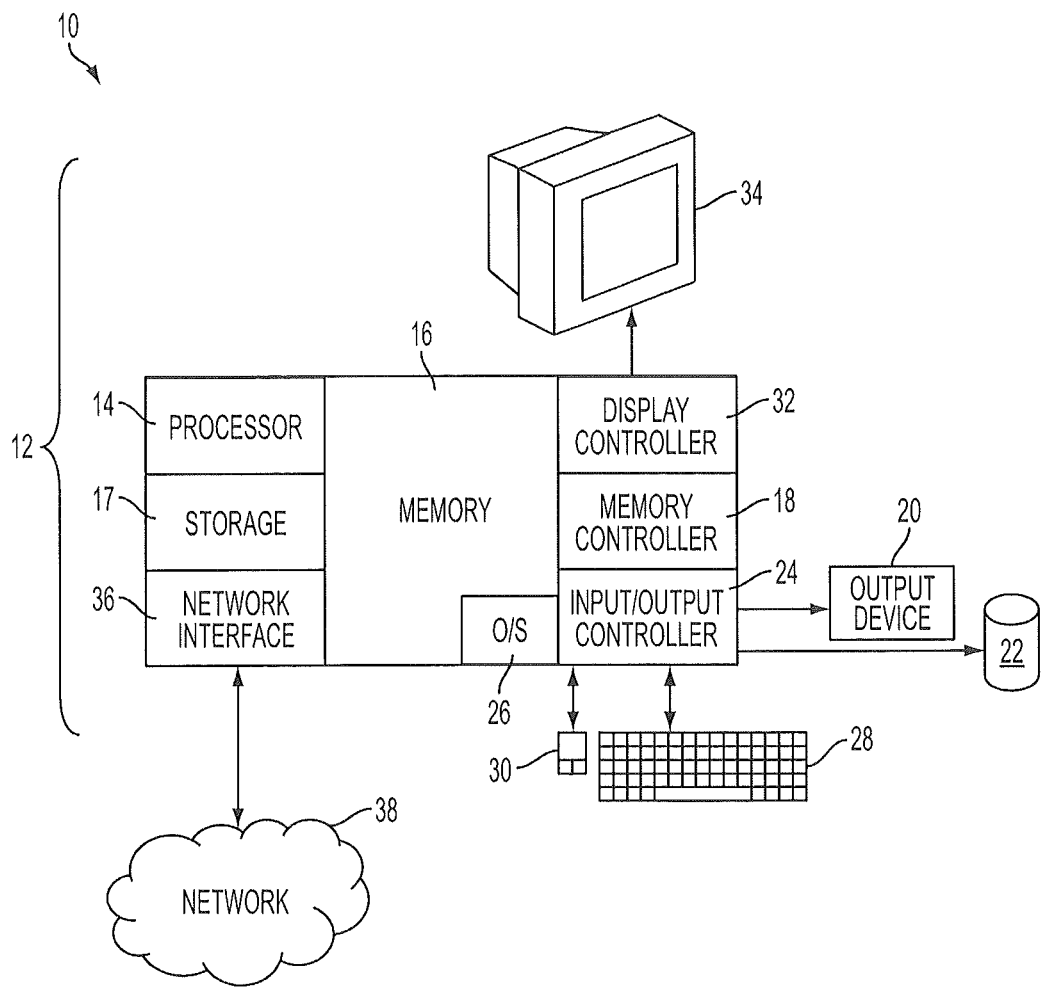
FIG. 1 illustrates a block diagram of a system 100 for instruction balancing within a multi-threaded processor through instruction uncertainty.

FIG. 1 illustrates a block diagram of a processing system 10 for performing various processes including embodiments described herein. The methods described herein can be implemented in hardware, software (e.g., firmware), or a combination thereof. In an exemplary embodiment, the methods described herein are implemented in hardware as part of the microprocessor of a special or general-purpose digital computer, such as a personal computer, workstation, minicomputer, or mainframe computer. The system 100 therefore includes general-purpose computer 12.

In an exemplary embodiment, in terms of hardware architecture, as shown in FIG. 1, the computer 12 includes a processor 14, memory 16 coupled to a memory controller 18, and one or more input and/or output (I/O) devices 20, 22 (or peripherals) that are communicatively coupled via a local input/output controller 24. The input/output controller 24 can be, for example but not limited to, one or more buses or other wired or wireless connections, as is known in the art. The input/output controller 24 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 14 may be a hardware device for executing software, particularly that stored in memory 16. The processor 14 can be any custom made or commercially available processor, a central processing unit (CPU), an auxiliary processor among several processors associated with the computer 12, a semiconductor based microprocessor (in the form of a microchip or chip set), a macroprocessor, or generally any device for executing instructions.

The memory 16 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 16 may incorporate electronic, magnetic, optical, and/or other types of storage media. Note that the memory 16 can have a distributed architecture, where various components are situated remote from one another, but can be accessed by the processor 14. Additional storage devices 17 may be included as desired.

The instructions in memory 16 may include one or more separate programs, each of which comprises an ordered listing of executable instructions for implementing logical functions. In the example of FIG. 1, the instructions in the memory 16 include a suitable operating system (OS) 26. The operating system 26 essentially controls the execution of other computer programs and provides scheduling, input-output control, file and data management, memory management, and communication control and related services.

In an exemplary embodiment, input devices such as a keyboard 28 and mouse 30 can be coupled to the input/output controller 24. Other output devices such as the I/O devices 20, 22 may include input devices, for example but not limited to a printer, a scanner, microphone, and the like. Finally, the I/O devices 20, 22 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 10 can further include a display controller 32 coupled to a display 34. In an exemplary embodiment, the system 10 can further include a network interface 36 for coupling to a network 38 for communication between the computer 12 and any external server, client and the like.

When the computer 12 is in operation, the processor 14 is configured to execute instructions stored within the memory 16, to communicate data to and from the memory 16, and to generally control operations of the computer 12 pursuant to the instructions.

The processing system 10, computer 12, I/O devices 20, 22 and/or other suitable processing devices or processors are configured to receive and decode data that may be received in a compressed format. In one embodiment, the data is received as an encoded data stream having variable length portions of compressed data. The encoded data stream is decoded by a processing device or processor so that the original data that was compressed can be processed. The encoded data stream may be transmitted by one or more other processing systems or computers in communication with the computer 12, e.g., via one or more networks 38.

A variable length encoded data stream may be encoded using any suitable encoding algorithm that generates variable length symbols to encode original non-encoded data. The term "symbol" as it is used herein with regard to the encoded data stream refers to an encoding representation in the encoded data stream where each symbol may be decoded/decompressed to create one or more bytes or groups of original data (i.e., data prior to encoding). For a given compression algorithm, the data may be represented by any number of symbols, some of which have different lengths (e.g., number of bits) and/or are associated with different alphabets or other symbol groups.

Some exemplary compression algorithms utilize a DEFLATE algorithm to encode data into symbols. Other exemplary algorithms include Lempel-Ziv algorithms and huffman coding algorithms. Examples of data formats that utilize variable length compression include .zip, .gzip and .gif formats. It is noted that the embodiments are not limited to use with the compression algorithms/formats described herein, and can be used with any encoding and/or compression scheme that generates variable length symbols.

Typically, variable length encoded data streams do not lend themselves to parallel decoding operations, i.e., a processor or data processing system is not able to decode portions of the data stream in parallel. This is because there are no byte alignment markers in the data stream and thus, it cannot be determined from the data stream where one portion of data starts and ends and another portion of data starts and ends. As a result, typical methods for decompression are not capable of processing in parallel, and thus use a sequential decoding operation which limits the throughput and speed by which the decoding of the variable length encoded data stream may be accomplished.

For example, in a dynamic huffman encoded file, symbol lengths vary from 1 bit to 28 bits long. Because they consist of symbols of varying length, conventional processes for decoding these files are inherently sequential, as knowledge of where a given symbol starts requires the decoding of all previous symbols.

In addition, compression formats that utilize adaptive or dynamic huffman coding increase the difficulty in decoding. Static huffman coding typically provides a limited number of codes or symbols, and a limited difference in length between the shortest and longest possible codes. Dynamic huffman coding is not so limited and thus further constrains potential decompression techniques.

Embodiments of systems and methods described herein address this problem and have benefits and technical effects that include providing an efficient mechanism for processing coded data and/or for parallel decoding of variable symbol length data streams. In one embodiment, a processor (e.g., in the system 10) is configured to divide encoded input data into fixed length blocks (e.g. 8 bytes per block), and pre-process each block without any information about the starting position of the first symbol. After pre-processing, for each block of the encoded data, the processor can compute in one clock cycle the starting position of the first symbol in the next block given the starting position of the first symbol in a currently selected or current block. This allows for high-bandwidth pipelined decompressor implementations.

As described herein, a "block" refers to a selected segment or line of an encoded data stream having a fixed length, e.g., a fixed number of bits or bytes. The block length can be based on any suitable criteria, e.g., the amount of data that the processor can receive or process in one clock cycle. A "current block" or "selected block" refers to the block that is currently being processed or pre-processed as described herein. A "next block" refers to the block of data that immediately follows the current block in the encoded data stream.

Figure 2:
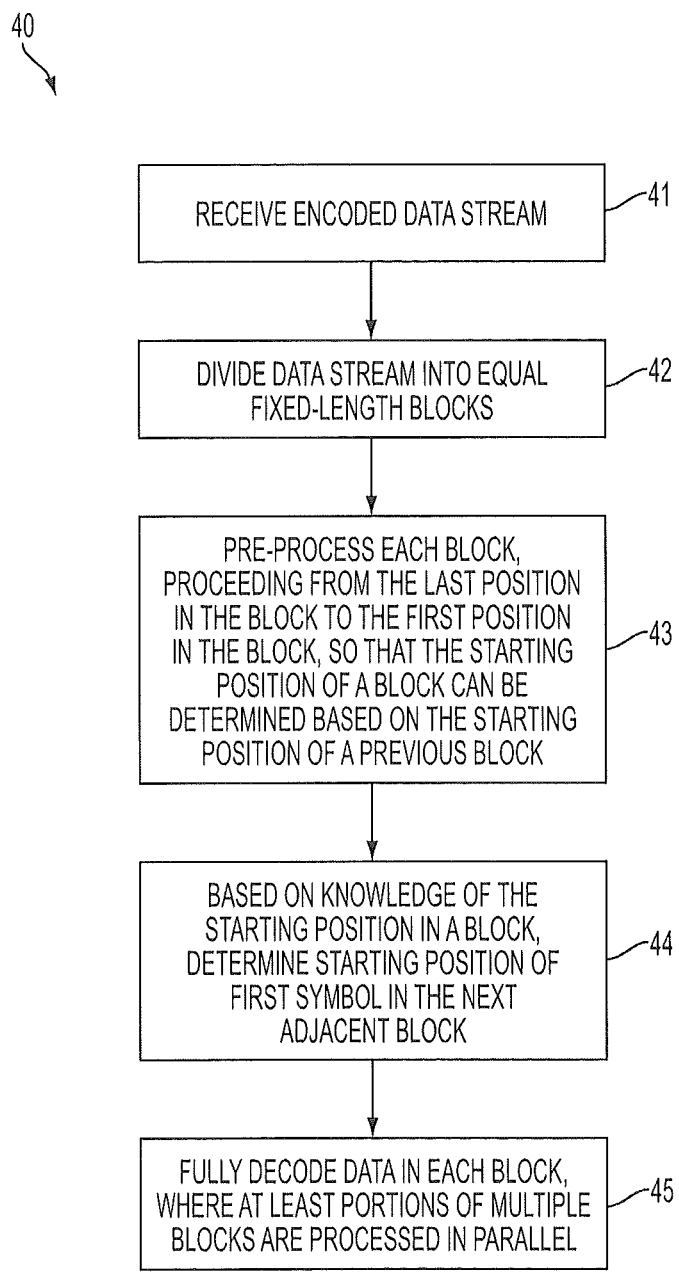
FIG. 2 illustrates a flow chart for an embodiment of a method of decoding received data.

Referring to FIG. 2, an embodiment of a method 40 of pre-processing and decoding and/or decompressing variable symbol length data streams is shown. The method 40 includes one or more stages 41-45. In one embodiment, the method includes the execution of all of the stages 41-45 in the order described. However, certain stages may be omitted, stages may be added, or the order of the stages changed. The method 40 may be performed using components of the system 10, but is not so limited, and can be used in conjunction with any suitable processing device or system and any suitable hardware and/or software configuration.

In the first stage 41, an encoded data stream is received by a processing device, e.g., the system 10 and/or an I/O device 20, 22. In one embodiment, the encoded data stream includes encoded symbols representing a string of original data (e.g., text characters). For example, the encoded data stream is a set of data encoded in one or more .gzip files.

In the second stage 42, the processing device divides the received data stream into fixed length blocks (e.g., 8 bytes per block). In one embodiment, the length of each block is selected to correspond to the amount (e.g., number of bytes) of received data that is desired to be output for each processor clock cycle. The blocks may all have an equal length or be of varying lengths.

Because the symbols in the received data stream do not have a fixed length, the starting position of the first symbol in each block subsequent to the first block is not known prior to decoding. In some blocks, a symbol may spill over from a current block into the next block, causing the starting position of the first symbol of the next block to be other than the first position of the next block. A "starting position" of a symbol refers to the (typically left-most) position at which a symbol begins. The "position" in a stream or block refers to the position of a portion of data (e.g. a bit, byte or symbol) in a stream relative to other portions in the stream. Positions progress from a first or earliest position referring to data that is processed earliest, to a last or latest position referring to data that is processed last (e.g., data in the last position of a block is the last is processed last wen the block is decoded). In order to allow for parallel processing of each encoded data block, the starting position of the first complete symbol in each block is identified as described below.

Figure 3:
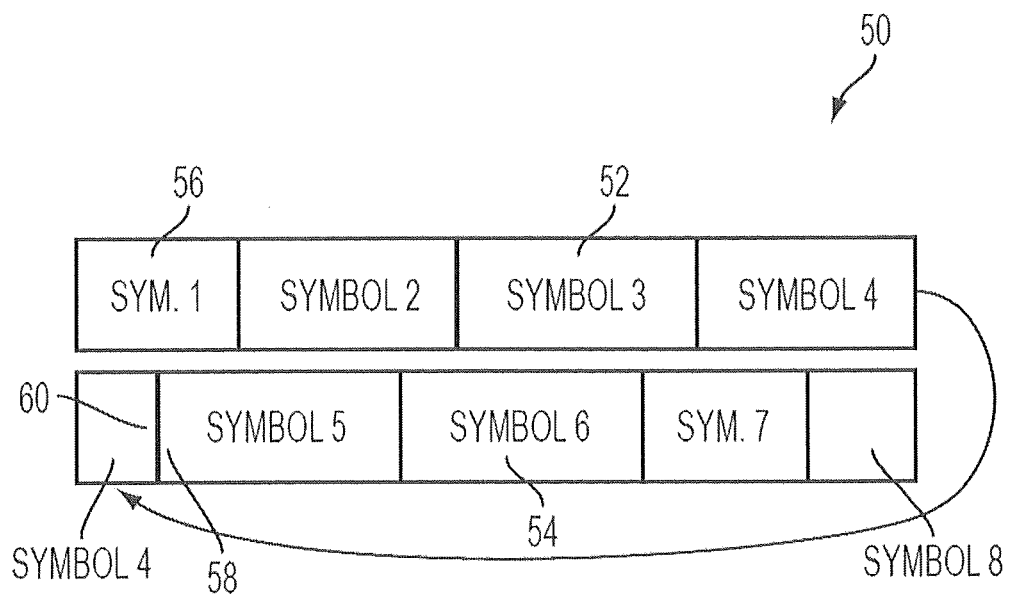
FIG. 3 illustrates an example of a portion of an encoded data stream.

An example of a portion of a data stream 50 that has been divided into equal-length blocks is shown in FIG. 3. The stream 50 includes a first block 52 and a second block 54 immediately following the first block 52. The first block 52 includes Symbols 1-4. In the first block 52, the starting position of the first symbol (Symbol 1) is the first or earliest bit position 56. Because the total length of Symbols 1-4 exceeds the length of the first block 52, Symbol 4 spills over into the second block 54. The first symbol of the second block 54 (Symbol 5) and the first symbol starting point 58 (first position of Symbol 5) is thus offset and begins at a position after the beginning of the second block 54. The starting position 58 of the Symbol 5 immediately follows the last position 60 of Symbol 4. In order to be able to process both blocks without waiting for decoding of the first block to complete, the starting position of symbol 5 should be known.

In the third stage 43, each block is pre-processed (i.e., processed prior to fully decoding the data in the block) to calculate possible starting positions of each block based on possible symbols and based on possible starting positions of an adjacent previous block. Each block is pre-processed so that if the starting position of the first symbol in a block is known, the starting position of the first complete symbol in the next block (i.e., adjacent block located after the block) can be determined rapidly (e.g., in one clock cycle).

In one embodiment, for each block (starting at the first block in the data stream), all possible starting positions are evaluated, starting from the last possible starting position (e.g., the last bit in the block) and proceeding sequentially from the last possible starting position to the first possible starting position. This evaluation includes, for each possible position, determining what the starting position in the next block would be if a given symbol was to start at the bit position. This determination includes identifying the symbol (or in some cases, multiple possible symbols) that would start at that position by decoding some number of bits. If the number of bits does not indicate a valid symbol, the current bit position is disregarded.

Evaluation of each possible position is performed for a symbol identified for that position or, if multiple symbols are identified, performed for each symbol. The results are recorded in a look-up table (or other suitable data structure) that is indexed for each bit position associated with a block.

To illustrate this embodiment, an example is discussed with reference to a block having "n" bit positions. The compression or coding algorithm is a variable symbol length algorithm that specifies a number "M" of symbols referred to as S1, S2, S3 . . . SM, each having a defined length (e.g., in bits).

In this example, the first block is selected and pre-processed. Starting with bit position n, the processing device uses information from the decoding algorithm to determine what the starting position of the first symbol in the next block (adjacent block following the first block) would be. A number of bits starting at bit position n is inspected and the symbol is identified, e.g., symbol S1. The first symbol starting position of the next block is calculated by adding the number of bits defined for the symbol S1 to the bit position n to find the starting position in the next block. The result is saved in a look-up table indexed to this block and position. If multiple symbols could start at position n, the starting position is again calculated for additional possible symbols until all possible starting positions in the next block are found that are associated with bit position n in the first block. The processing device then proceeds to the bit position immediately preceding the bit position n. The symbol that would start at position "n–1" is identified, e.g., symbol S2, the number of bits corresponding to the length of S2 is added to the bit position n to find the starting position, and the starting position is stored in the look-up table.

The processing device proceeds sequentially in this manner through all of the possible bit positions of the first block until the first bit position in the first block is reached and pre-processed.

In some instances, a symbol applied to a possible starting position does not spill over, but rather ends within the current block. In such instances, the starting position of the next symbol would not occur in the next block, but would rather occur in the current block. To account for such instances, in one embodiment, the third stage 43 includes determining the length of a symbol ("the current symbol") that would begin at a possible starting position, and determining the position at which the following symbol would start by adding the length of the current symbol to the current starting position. If the starting position of the following symbol is in the next block, this result is recorded in a look-up table at an index given by this bit position. If the starting position of the following symbol is in the current block, the starting position in the next block is determined by looking up from the look-up table the entry indexed to the starting position of the following symbol in the current block, and recording that starting position in an entry associated with the current starting position.

In the fourth stage 44, the first symbol in the first starting position of the first block is determined. This information may be retrieved from coding information provided by the transmitting entity. Using the knowledge of the first symbol, the first starting position in the next adjacent block is rapidly determined (e.g. once per clock-cycle in a hardware implementation). The first starting position in the next block may be determined by looking up the first starting position in a look-up table indexed to the first block.

The processing device then proceeds to the second block, and determines the starting position of the third block using the starting position of the second block determined above. The starting position of the third block may be determined by looking up the starting position of the third block in an appropriate look-up table. The starting position of each succeeding block is determined in this way until all of the starting positions are known.

In the fifth stage 45, the data is fully decoded by, e.g., feeding each block into a pipeline to fully decode the symbols, starting from the pre-determined position of the first symbol in each line. In one embodiment, each block is aligned so that the starting position in each block is used to decode the symbols in each block, and two or more of the blocks are input into parallel pipelines so that the blocks can be decoded in parallel.

Figure 4:
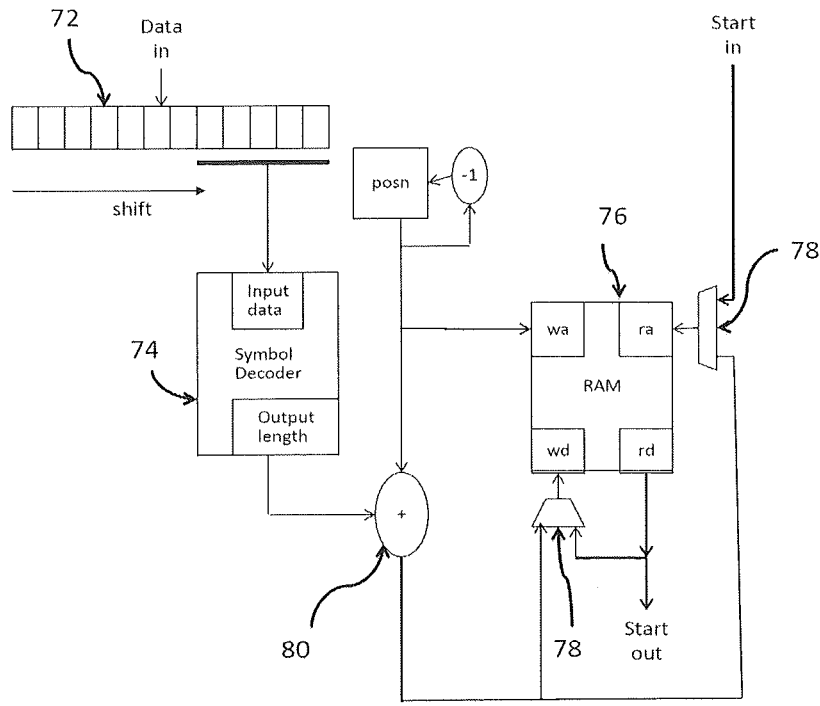
FIG. 4 illustrates a block diagram of an embodiment of an encoded data pre-processing system.
Figure 5:
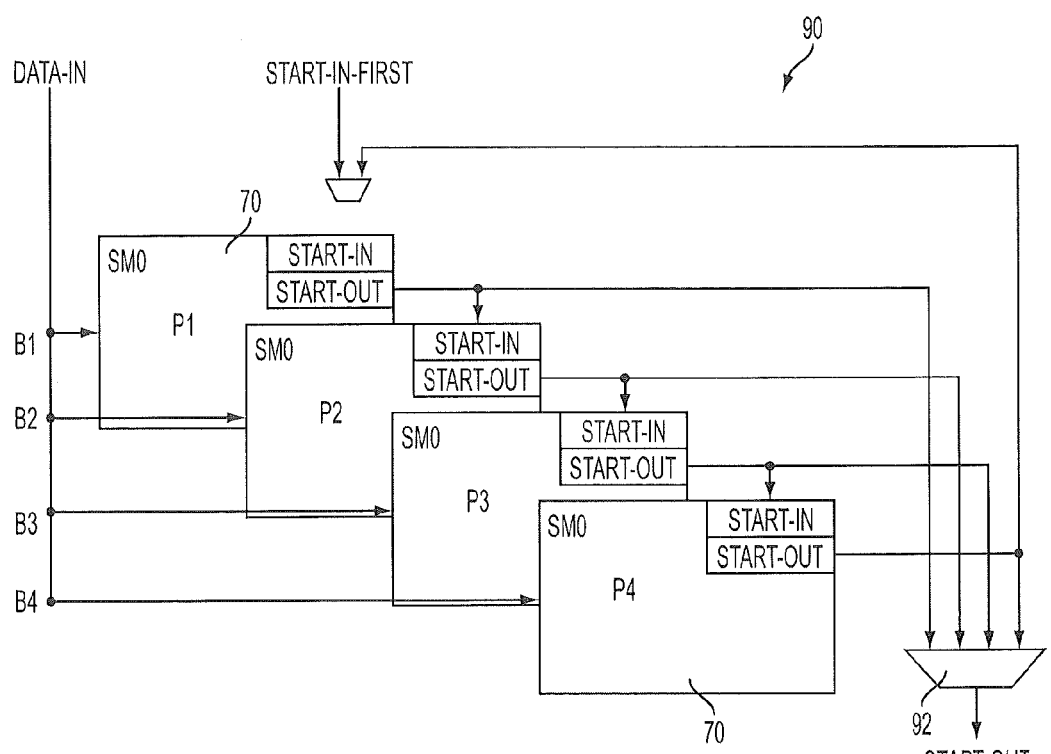
FIG. 5 illustrates a block diagram of an embodiment of an encoded data pre-processing system.

FIGS. 4 and 5 show examples of a processing device embodied as one or more pre-processing engines. FIG. 4 shows an exemplary pre-processing engine 70 configured to perform the method 40. In these examples, the pre-processing engine 70 is embodied in a hardware configuration, however the engine could be otherwise embodied, e.g., as software. In one example, the pre-processing engine(s) and other components such as encoders and/or decoders are embodied in an I/O device or devices 20, 22 shown in FIG. 1.

Referring to FIG. 4, the pre-processing engine 70 includes a shift register 72, a symbol decoder 74 and a memory 76. In this example, the engine 70 is configured to pre-process 8-byte data blocks and the memory 76 includes a SRAM (64 rows, 6 columns), a 79-bit shift register 72 and two small (2 way, 6 bit) multiplexors 78. Although a single engine is shown for preprocessing a block, the engine can be pipelined as desired. The pre-processing engine 70 in this example processes one bit position per cycle.

The engine 70 performs the pre-processing by receiving the first block as "data in" to the shift register 72. The last position is input to the decoder 74 as "input data", and the decoder identifies the symbol that starts at this position and determines the output length for the symbol. The symbol may be identified by fully or partially decoding the symbol, e.g., by inspecting the bit progression starting at the position. One or more of the bits in the bit progression are used to identify the symbol based on the coding scheme. The "output length" and the current bit position (the last bit position of the first block at this point of the pre-processing) are input to an addition logical unit 80, which in turn writes the starting position data to the SRAM 76 along with a write address (wa) input indicating the current bit position. This information is stored in an indexed look-up table. The engine then decrements the current position of the first block to the immediately preceding bit position, shifts the block in the register 72 accordingly, and repeats the pre-processing. The engine 70 repeats the computation for each preceding possible starting position until the beginning position of the first block is reached.

After determining the next block starting position for each bit position in the current block, the pre-processing engine 70 is able to output a starting position of the next block based on an input that specifies the starting position of the current block. For example, the engine 70 receives the starting position of the first block as a "start in" input, which may be the first bit position or could be a different bit position. In response to the "start in", the engine 70 looks up the corresponding starting position for the next block in the look-up table and outputs the starting position as "start out". The "start out" may be provided as a "start in" input to another engine or processor that decodes the next block based on the starting position.

As shown in FIG. 3, the pre-processing engine 70 only requires one look-up table per block. However, the engine is not so limited, as multiple blocks may be included to correspond to multiple symbols, e.g., if more than one symbol could start at a given bit position (e.g., symbols from multiple alphabets).

The engine 70 then receives the second block and preprocesses the second block. The engine 70 pre-processes each block in order, at a rate of, e.g., one block every 64 cycles. When the pre-processing is complete, all possible starting positions for each block are stored in associated look-up tables.

In one embodiment as shown in FIG. 4, for each bit position, the decoder 74 receives the input data and computes where the next symbol would start if a symbol were to start at this bit location. If the answer lies in the next block, i.e., the starting position occurs in the next block, the answer is recorded in the SRAM using the current bit position as a write address. If the answer lies in the current block, the starting bit position of the next symbol is used as an address to look up the next block starting position from the SRAM, and the resulting next block starting address is stored using the current bit position as a write address.

When done, the SRAM contains, for each possible starting position of a symbol, the starting location of the first symbol in the next line were this line to contain a symbol starting at that bit position. As a result of the pre-processing, if the starting position of the first symbol in this block is provided, the question of "where does the next line start" can be quickly answered (e.g., in one clock cycle) by looking up the answer in the SRAM.

In one embodiment, multiple pre-processors are combined to increase throughput. FIG. 5 shows an example of a pre-processing system 90 that includes multiple pre-processors 70 in a pipeline. The configuration of this pipeline and the number and configuration of the pre-processors described in this embodiment are exemplary, as any suitable processing devices capable of performing the methods described herein may be used in any suitable pipeline configuration. In one example, the blocks are divided into 64-bit lengths, each pre-processor 70 has 64 states and provides an output of 6 bits, requiring only one small multiplexer 92 (e.g., 64 way, 6 bit multiplexer).

In this embodiment, the system 90 has n pre-processors 70, each of which accepts new data every n cycles (where n is the block size), so that the combination can accept one block per cycle. For example, for 64-bit blocks, the system includes 64 pre-processors. Each pre-processor provides a "start out" output as described with reference to FIG. 4. The start-out is output from a pre-processor 70 and indicates the starting position of the next block for a bit of the current block. The output is provided as a "start in" input to the immediately following pre-processor, which uses the start in and processes the next block using the start-in as a starting position.

For example, for a data stream having four blocks, shown as blocks B1-4, the processing system 90 may use four pre-processors 70, shown in FIG. 5 as P1-P4. The blocks B1, B2, B3 and B4 are input to the pre-processors P1, P2, P3 and P4 respectively. Each pre-processor pre-processes its respective block and generates at least one look-up table. When pre-processing is complete, at a first clock cycle, P1 receives a starting bit position of the first block B1 as "start-in-first" and provides a starting position output "start-out" to the multiplexer ("mux") 92 and to P2. At the next clock cycle (a second clock cycle), P2 receives the starting position as a "start-in" input and outputs a "start-out" that indicates the starting position for block B3. At the third clock cycle, P3 receives the B3 starting position from P2 and outputs the starting position of B4. By the fourth clock cycle, all of the pre-processors have received their respective starting points. This process continues for any number of subsequent processors and/or may cycle back to P1 for processing of further block. In this way, all of the starting positions of all the block can be determined at a rate of one block per cycle.

In one embodiment, in addition to symbol length, an encoding scheme may provide additional symbol characteristics. For example, some coding algorithms such as .gzip include symbols from different alphabets. In this embodiment, the pre-processing of stage 43 includes the additional steps of pre-processing each block so that if the position and alphabet (or other characteristic) of the starting symbol of each block is known, the starting position and alphabet of the starting symbol of the next block can be determined rapidly.

For example, starting with the last bit position in the block, and repeating for each bit position until the first bit position in the block, the processing device determines the starting position and the alphabet of the first symbol in the next block for a given symbol. The starting position and alphabet are recorded in, e.g., a look-up table. The length and alphabet of the symbol can be determined by partially or fully decoding the symbol.

In one embodiment, determining the starting position of the next block includes adding the length of the current symbol to the current bit position, and determining the alphabet of the next symbol based on rules provided by the encoding scheme, e.g., by the grammar of the type of stream being decoded. If the starting position of the next symbol is in the current block, the starting position of the next symbol is read from a look-up table indexed to that starting position, and the starting position of the next block is stored from the table entry. If the starting position of the next symbol is in the next block, recording this result in the table at an index given by this bit position.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium.

A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for decoding data, comprising:
processing circuitry including a pre-processing engine and a decoding pipeline, the processing circuitry configured to perform:
receiving a data stream, the data stream encoded by an encoding algorithm and transmitted as a plurality of variable length symbols;
dividing the data stream into a sequence of blocks, each block having a sequence of adjacent bit positions starting with a first bit position and ending with a last bit position;
pre-processing each block prior to fully decoding each block by the pre-processing engine, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and
inputting the data stream into the pipeline and fully decoding each block by decoding a first block starting at the first bit position and decoding each adjacent block starting at the starting position.

2. The apparatus of claim 1, wherein the encoding algorithm is a compression algorithm, and decoding includes expanding data represented by each symbol to recreate an original data stream.

3. The apparatus of claim 1, wherein determining the starting position includes identifying a symbol and determining the starting position based on a length of the symbol.

4. The apparatus of claim 1, wherein determining the starting position includes storing the starting position in a table indexed to the current block and the selected bit position.

5. The apparatus of claim 3, wherein determining the starting position includes:
determining the length of the identified symbol that would begin at the selected bit position; and
calculating a position of a following symbol by adding the length of the identified symbol to the selected bit position.

6. The apparatus of claim 5, wherein calculating the starting position includes:
- responsive to the position of the following symbol being in the adjacent block, recording the position as the starting position in the table; and
- responsive to the position of the following symbol being in the selected block, reading the starting position of the first symbol in the next block from an entry in the table corresponding to the position, and recording the starting position in the table.

7. The apparatus of claim 1, wherein the pre-processing engine is configured to pre-process two or more of the blocks in parallel.

8. A computer program product for decoding data, the computer program product comprising:
- a non-transitory tangible storage medium readable by a processing circuit and storing instructions for execution by the processing circuit for performing:
  - receiving a data stream, the data stream encoded by an encoding algorithm and transmitted as a plurality of variable length symbols;
- dividing the data stream into a sequence of blocks, each block having a sequence of adjacent bit positions starting with a first bit position and ending with a last bit position;
- pre-processing each block prior to fully decoding each block, wherein pre-processing includes, for each block, selecting a bit position in a current block and determining a starting position of a first symbol in an adjacent block based on the selected bit position, wherein determining is initially performed for the last bit position in the current block, and is repeated sequentially for each preceding bit position through and including the first bit position; and
- fully decoding each block by decoding a first block starting at the first bit position and decoding each adjacent block starting at the starting position.

9. The computer program product of claim 8, wherein determining the starting position includes identifying a symbol and determining the starting position based on a length of the symbol, and storing the starting position in a table indexed to the current block and the selected bit position.

10. The computer program product of claim 9, wherein determining the starting position includes:
- determining the length of the identified symbol that would begin at the selected bit position;
- calculating a position of a following symbol by adding the length of the identified symbol to the selected bit position;
  - responsive to the position of the following symbol being in the adjacent block, recording the position as the starting position in the table; and
- responsive to the position of the following symbol being in the selected block, reading the starting position of the first symbol in the next block from an entry in the table corresponding to the position, and recording the starting position in the table.

* * * * *